United States Patent
Park

(10) Patent No.: US 9,366,801 B2
(45) Date of Patent: Jun. 14, 2016

(54) LIGHT EMITTING MODULE, BACKLIGHT UNIT INCLUDING THE LIGHT EMITTING MODULE, AND LIQUID CRYSTAL DISPLAY INCLUDING THE BACKLIGHT UNIT

(71) Applicant: Samsung Display Co., Ltd., Yongin, Gyeonggi-do (KR)

(72) Inventor: Se Ki Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 114 days.

(21) Appl. No.: 14/149,451

(22) Filed: Jan. 7, 2014

(65) Prior Publication Data

US 2015/0062494 A1 Mar. 5, 2015

(30) Foreign Application Priority Data

Aug. 28, 2013 (KR) ................... 10-2013-0102576

(51) Int. Cl.
*G02F 1/1333* (2006.01)
*F21V 8/00* (2006.01)
*H01L 33/60* (2010.01)
*H01L 25/075* (2006.01)

(52) U.S. Cl.
CPC ............ *G02B 6/0068* (2013.01); *G02B 6/0031* (2013.01); *H01L 33/60* (2013.01); *H01L 25/0753* (2013.01); *H01L 2924/0002* (2013.01)

(58) Field of Classification Search
CPC ... G02B 6/0068; H01L 33/60; H01L 25/0753
USPC ............... 349/58, 60, 61, 62, 65; 257/88, 98, 257/E33.061, E33.072, E27.72; 362/612, 362/632–634
See application file for complete search history.

(56) References Cited

U.S. PATENT DOCUMENTS

| | | | |
|---|---|---|---|
| 2005/0117352 A1 | 6/2005 | Lin | |
| 2005/0121686 A1* | 6/2005 | Keller | H01L 25/167 257/99 |
| 2007/0114267 A1* | 5/2007 | Hsu | 228/155 |
| 2007/0206130 A1* | 9/2007 | Wuu | H01L 33/20 349/88 |
| 2008/0006838 A1* | 1/2008 | Hattori | H01L 33/20 257/103 |
| 2009/0141208 A1* | 6/2009 | Byoun | G02F 1/133606 349/58 |
| 2009/0225543 A1* | 9/2009 | Jacobson et al. | 362/247 |
| 2010/0110660 A1 | 5/2010 | Brukilacchio | |
| 2010/0123159 A1* | 5/2010 | Song et al. | 257/99 |
| 2011/0068354 A1 | 3/2011 | Tran et al. | |
| 2011/0133224 A1 | 6/2011 | Zoorob et al. | |
| 2013/0010232 A1* | 1/2013 | Takahashi | F21K 9/135 349/64 |
| 2013/0092961 A1* | 4/2013 | Kim | H01L 33/507 257/88 |
| 2013/0286294 A1* | 10/2013 | Hosoki | G02B 6/0091 348/739 |

FOREIGN PATENT DOCUMENTS

| | | | |
|---|---|---|---|
| JP | 2008-258284 | 10/2008 | |
| JP | WO/2012/093595 | * 7/2012 | F21S 2/00 |
| JP | 2013-004923 | 1/2013 | |
| KR | 10-2008-0032506 | 4/2008 | |
| KR | 10-2011-0137927 | 12/2011 | |
| KR | 10-2013-0036447 | 4/2013 | |

* cited by examiner

Primary Examiner — Sang V Nguyen
(74) Attorney, Agent, or Firm — Knobbe Martens Olson & Bear LLP

(57) ABSTRACT

A light emitting module includes at least one light emitting chip mounted on a substrate, a sidewall including a fastener fastened to the substrate and surrounding the light emitting chip, and a transparent resin mixed with phosphor configured to fill a space partitioned by the sidewall.

18 Claims, 16 Drawing Sheets

LIGHT EMITTING MODULE, BACKLIGHT UNIT INCLUDING THE LIGHT EMITTING MODULE, AND LIQUID CRYSTAL DISPLAY INCLUDING THE BACKLIGHT UNIT

CROSS-REFERENCE TO RELATED APPLICATIONS

This application claims priority from Korean Patent Application No. 10-2013-0102576, filed on Aug. 28, 2013 in the Korean Intellectual Property Office, the disclosure of which is incorporated herein by reference in its entirety.

BACKGROUND

1. Field

The present disclosure relates to a light emitting module having at least one light emitting chip, a backlight unit including the light emitting module, and a liquid crystal display including the backlight unit.

2. Description of the Related Technology

A liquid crystal display (LCD), which is advantageous in displaying a moving image, has a high contrast ratio, and thus is commonly used in a TV or a monitor, represents the image implementation principle through optical anisotropy and polarization of liquid crystals.

The liquid crystal display typically includes a liquid crystal panel, in which a liquid crystal layer is interposed and adhered between two substrates that are in parallel to each other, as its essential constituent element, and implements permeability difference through changing the alignment direction of liquid crystal molecules by means of an electric field in the liquid crystal panel.

However, the liquid crystal panel is not self-luminous, and thus a separate light source is required to display the permeability difference as an image. For this, a backlight, in which light sources are built, is generally arranged on a rear surface of the liquid crystal panel.

The backlight of the liquid crystal display may be classified into a direct type and an edge type, according to a lamp alignment method thereof. The edge type has a structure in which one or a pair of light sources are arranged on one side portion of a light guide plate, and two or two pairs of light sources are arranged on both side portions of the light guide plate, and the direct type has a structure in which several light sources are arranged on a lower portion of a liquid crystal panel. The direct type is limited in thin filming, and thus is mainly used in a liquid crystal display that attaches more importance to brightness of a screen than to thickness of the screen, and the edge type, which is more advantageous in thin filming than the direct type, is mainly used in a liquid crystal display that attaches more importance to the thickness of the screen, such as a notebook PC or a monitor PC.

Recently, as research into a thin film liquid crystal display has expanded, research into an edge type backlight has also expanded.

SUMMARY OF CERTAIN INVENTIVE ASPECTS

One subject to be solved is to provide a light emitting module which can minimize a light loss.

Another subject to be solved is to provide a backlight unit which can minimize a light loss.

Still another subject to be solved is to provide a liquid crystal display which can minimize a light loss.

Additional advantages, subjects, and features will be set forth in part in the description which follows and in part will become apparent to those having ordinary skill in the art upon examination of the following or may be learned from practice of the disclosure.

In one aspect, there is provided a light emitting module which includes at least one light emitting chip mounted on a substrate, a sidewall including a fastener fastened to the substrate and surrounding the light emitting chip, and a transparent resin mixed with phosphor and configured to fill a space partitioned by the sidewall.

In another aspect, a backlight unit which includes a light source portion which is in a bar shape that extends in a length direction and a light guide plate that comes in contact with the light source portion.

The details of other embodiments are included in the detailed description and drawings.

According to the embodiments, at least the following effects can be achieved.

Since the light that is incident from the light emitting chip to the side portion is reflected in the forward direction, the light loss can be minimized.

Further, since the light emitting chip and the sidewall for surrounding the light emitting chip are directly mounted on the substrate, the thickness of the light emitting module can be reduced.

The effects are not limited to the contents as exemplified above, but further various effects are included in the description.

BRIEF DESCRIPTION OF THE DRAWINGS

The above and other objects, features and advantages will be more apparent from the following detailed description taken in conjunction with the accompanying drawings, in which.

DETAILED DESCRIPTION OF CERTAIN INVENTIVE EMBODIMENTS

Figure 1:
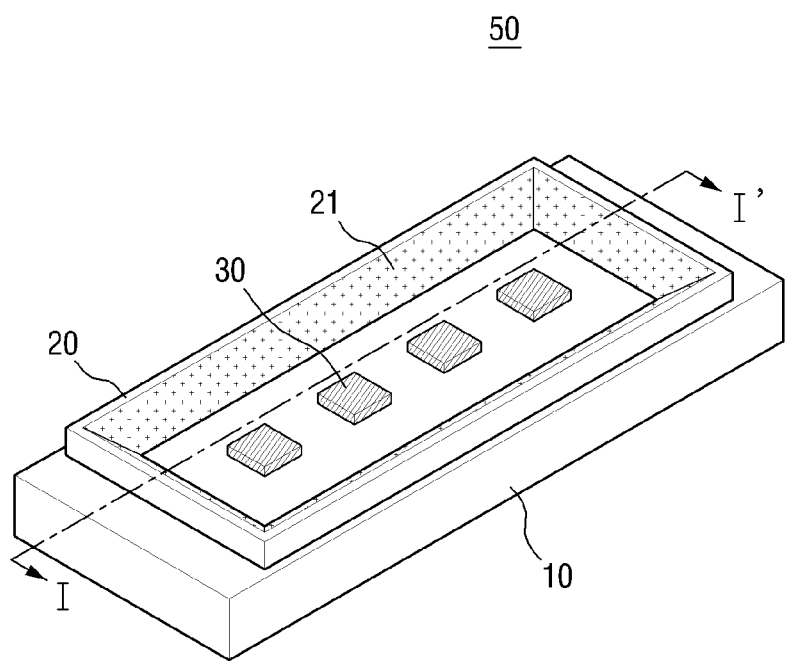
FIG. 1 is a perspective view of a light emitting module according to an embodiment.

The aspects and features and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

The term "on" that is used to designate that an element is on another element or located on a different layer or a layer includes both a case where an element is located directly on another element or a layer, and a case where an element is located on another element via another layer or still another element. In the entire description, the same drawing reference numerals are generally used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments of the present invention will be described with reference to the accompanying drawings.

A backlight module may include a light emitting module and a light guide plate, and the light emitting module and the light guide plate may be arranged to be spaced apart from each other for a predetermined distance. Because of this, a part of light that is incident from the light emitting module to the light guide plate may be lost to cause the light efficiency of a backlight unit to be lowered. On the other hand, the light emitting module may be manufactured in a manner that a light emitting chip is individually mounted on a package substrate to manufacture a light emitting package, and then a plurality of light emitting packages are bonded on a substrate. In the case of the light emitting module using separate package substrates as described above, the number of processes and the processing costs are increased, and the thickness of the backlight unit is increased. In order to solve the above-described problems, various technical attempts have been made.

Figure 2:
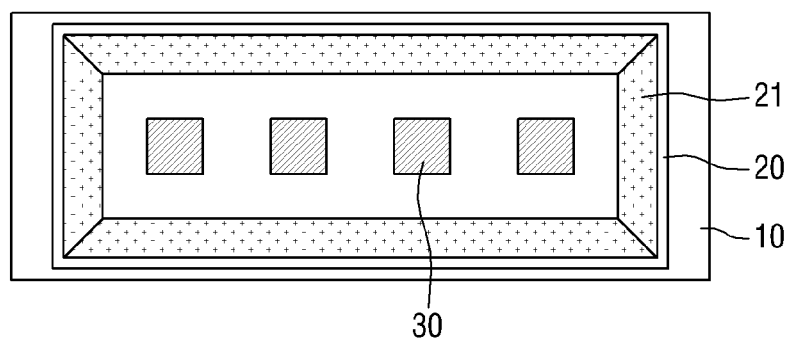
FIG. 2 is a plan view of a light emitting module according to an embodiment.
Figure 3:
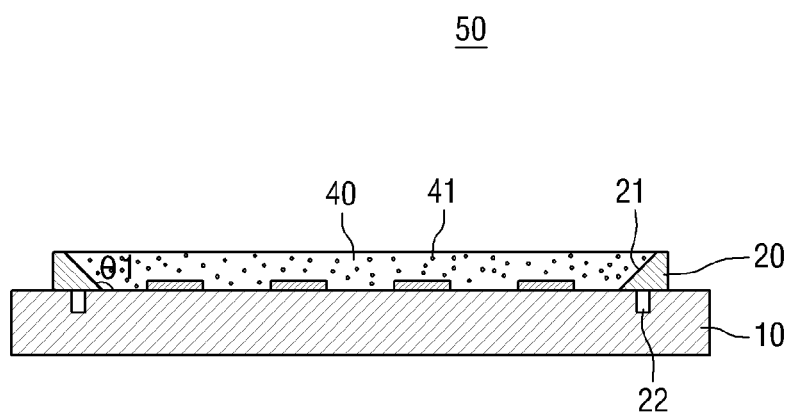
FIG. 3 is a cross-sectional view taken along line I-I' of FIG. 1.

FIG. 1 is a perspective view of a light emitting module according to an embodiment, FIG. 2 is a plan view of a light emitting module according to an embodiment, and FIG. 3 is a cross-sectional view taken along line I-I' of FIG. 1.

Referring to FIGS. 1 to 3, a light emitting module 50 according to an embodiment includes at least one light emitting chip 30 mounted on a substrate 10, a sidewall 20 having a fastener 22 to be fastened to the substrate 10 and surrounding the periphery of the light emitting chip 30, and a transparent resin 40 being mixed with phosphor and filling a space that is partitioned by the sidewall 20.

The substrate 10 may be a printed circuit board which provides a space where the light emitting chip 30 and the sidewall 20 are arranged, and in which a circuit pattern is formed. The substrate 10 may be made of metal having high thermal conductivity, ceramic, or an alloy including copper, nickel, and aluminum, but the material of the substrate 10 is not limited thereto.

On the substrate 10, the light emitting chip 30 may be mounted. Specifically, the light emitting chip 30 may be mounted on the substrate 10 in a COB (Chip On Board) type. The COB type may mean a shape that the light emitting chip 30 is mounted on the substrate 10 without being packaged. The light emitting chip 30 is not mounted on the substrate 10 in a state where it is mounted on a separate package substrate 10, but is mounted directly on the substrate 10. If the light emitting module 30 is directly mounted on the substrate 10, a relatively thin thickness can be obtained in comparison to a case where the light emitting chip 30 is mounted on the substrate 10 in a state where it is mounted on the separate package substrate 10.

One or more light emitting chips 30 may be mounted on the substrate 10. The plurality of light emitting chips 30 may be arranged on the substrate 10 to be spaced apart from each other for a predetermined distance. In one embodiment, the plurality of light emitting chips 30 may be arranged to be aligned in a line. However, the arrangement type of the light emitting chip 30 is not limited thereto, and the light emitting chips 30 may be arranged on the substrate 10 with various arrangement types.

The light emitting chip 30 may be a light emitting diode (LED) chip. The LED chip may generate blue, red, green, and infrared wavelengths. A single or a plurality of LED chips may be combined and arranged. In one embodiment, in a light emitting module, a single blue LED chip may be arranged, or a blue LED chip and a red LED chip may be arranged together. However, this is just an example, and the scope of the present invention is not limited thereto. A single or a plurality of LED chips, which generate blue, red, green, and infrared wavelengths, may be combined to be used as needed.

In the vicinity of the light emitting chip 30, the sidewall 20 that surrounds the light emitting chip 30 may be arranged. The sidewall 20 may be arranged to be spaced apart from the light emitting chip 30 by a predetermined distance. In some embodiments, the light emitting chip 30 and the sidewall 20 may come in partial contact with each other. The sidewall 20 may be higher than the light emitting chip 30. The distance between an upper surface of the substrate 10 and an upper surface of the sidewall 20 may be longer than the distance between the upper surface of the substrate 10 and an upper surface of the light emitting chip 30.

The sidewall 20 may serve to block light that is generated from the light emitting chip 30 in the side direction or to reflect the blocked light in the forward direction. The inner surface 21 of the sidewall 20 may form a reflective surface. Further, the light coming from the light emitting chip 30 may be incident to the sidewall 20, and then may be specularly reflected or diffusely reflected. For this, the degree of reflection and the reflection pattern of the light may be adjusted through adjustment of the surface roughness of the inner surface 21 of the sidewall 20. The inner surface 21 of the sidewall 20 may form an at least partly uneven pattern.

The sidewall 20 may be made of a transparent material having high reflection efficiency, a semi-transparent diffusion material, or an opaque reflection material. In some embodiments, synthetic resin or metal having high surface reflection ratio may be used as the material of the sidewall 20, but the material of the sidewall 20 is not limited thereto.

Further, in order to improve the reflection ratio of the inner surface 21 to the sidewall 20, a coating layer (not illustrated) may be formed on the inner surface 21 of the sidewall 20. The coating layer may include silver (Ag), titanium oxide ($TiO_2$), or silicon oxide ($SiO_2$), but is not limited thereto.

The inner surface 21 of the sidewall 20 may be downwardly inclined toward the light emitting chip 30. The inner surface 21 of the sidewall 20 may be inclined at a predetermined angle from the upper surface of the substrate 10, and may form a first angle θ1 with the upper surface of the substrate 10. The first angle θ1 may be an obtuse angle, but the range of the first angle θ1 is not limited thereto. In some embodiments, the first angle θ1 may be formed in the range of about 100 to about 150 degrees. If the inner surface 21 of the substrate 10 is inclined at the predetermined angle from the upper surface of the substrate 10 and forms the first angle θ1 with the upper surface of the substrate 10, the light coming from the light emitting chip 30 may be reflected by the inner surface 21 and may be guided to be directed toward the front. Depending on the degree of inclination of the first angle θ1, the quantity of light, which is reflected from the inner surface 21 and is directed toward the front, may differ. If the inner surface 21 forms the first angle θ1 with the upper surface of the substrate 10, the light coming from the light emitting chip 30 may be guided to the front to minimize a light loss.

The sidewall 20 may be directly mounted on the substrate 10. In order to be directly fastened to the substrate 10, the sidewall 20 may include a fastener 22.

Referring to FIG. 3, the space that is partitioned by the sidewall 20 may be filled with the transparent resin 40 mixed with the phosphor 41. The upper portion of the light emitting chip 30 arranged in the space that is defined by the sidewall 20 may be covered by the transparent resin that is mixed with the phosphor 41.

The transparent resin 40 may be spread through a transfer molding or dispensing process, but the spreading method of the transparent resin 40 is not limited thereto.

The transparent resin 40 may be epoxy resin, silicon resin, or a mixture thereof, but is not limited thereto.

The kind of phosphor 41 that is mixed with the transparent resin 40 may differ depending on the kind of light emitted from the light emitting chip 30. In some embodiments in which the light emitting chip 30 is a blue LED chip, YAG:Ce, which is yttrium (Y) aluminum (Al) garnet doped with cerium (Ce), series phosphor 41 may be a yellow phosphor 41 having a wavelength of about 530 nm to about 570 nm as a dominant wavelength. Further, if the light emitting chip 30 is an LED chip that emits infrared wavelengths, the phosphor 41 may be composed of phosphors 41 of three colors including red, green, and blue. Further, by adjusting the compounding ratio of the red, green, and blue phosphors 41, the light emitting color can be selected. In some embodiments, the red phosphor 41 may be a YOX series phosphor 41 that is composed of a compound of yttrium oxide (Y2O3) and europium (EU), which has a wavelength of about 611 nm as a dominant wavelength. The green phosphor 41 may be a LAP series phosphor 41 that is a compound of phosphate (Po4), lanthanum (La), and terbium (Tb), which has a wavelength of about 544 nm as a dominant wavelength. Further, the blue phosphor 41 may be a BAM blue series phosphor 41 that is a compound of barium (Ba), magnesium (Mg), an aluminum oxide series material, and europium, which has a wavelength of about 450 nm as a dominant wavelength. However, the kinds of phosphors as described above are just examples, and the scope of the present invention is not limited by the kinds of phosphors as described above.

If a power is supplied to the light emitting chip 30 in a state where the transparent resin 40 that is mixed with the phosphor 41 is spread on the upper portions of the light emitting chips 30, the respective light emitting chips 30 emit light, and parts of the light coming from the light emitting chips 30 excite the phosphors 41 and are mixed with the light emitted by the phosphors 41 to provide white light.

Figure 4:
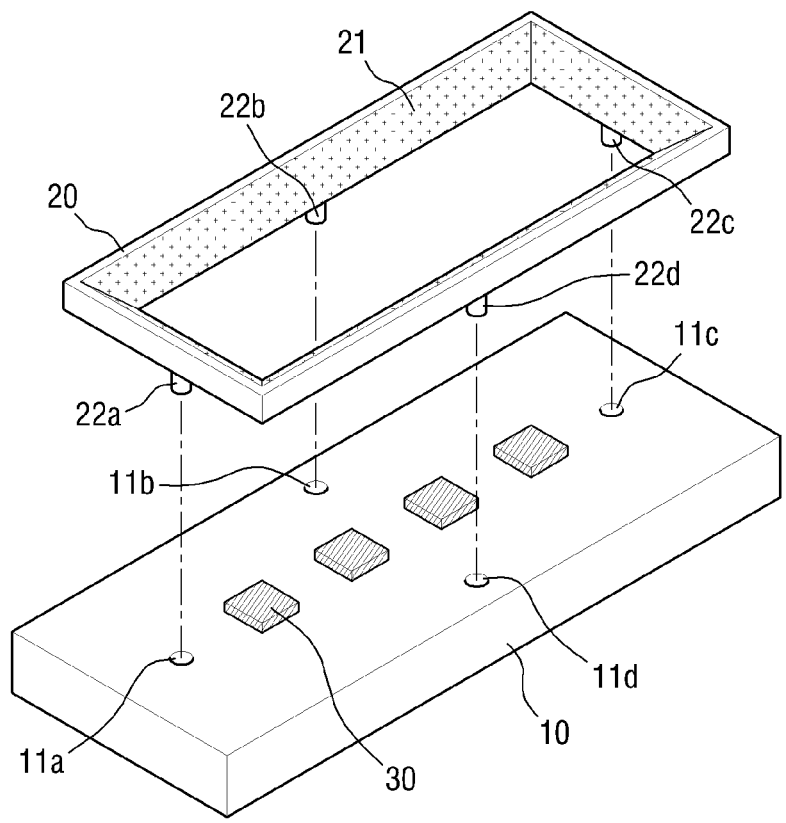
FIG. 4 is a perspective view of a light emitting module according to an embodiment.

FIG. 4 is a perspective view of a light emitting module according to an embodiment. Referring to FIG. 4, the sidewall 20 may be directly fastened to the substrate 10.

As described above, the sidewall 20 may include the fastener 22 to be fastened to the substrate 10. In some embodiments, the fastener 22 may include at least one projection portion. The projection portion may project for a predetermined distance in the gravity direction from the lower surface of the sidewall 20. FIG. 4 exemplifies that projection portions 22a, 22b, 22c, and 22d are respectively formed on four sides of the sidewall 20, but the number of projection portions is not limited thereto. One or more projection portions may be formed on each side, or the number of projection portions may be smaller than the number of sides.

In the case where the fastener 22 of the sidewall 20 includes the projection portion(s), at least one recessed portion may be formed on the substrate 10 to correspond to the projection portion(s). The number of recessed portions may be equal to the number of projection portions, but is not limited thereto. As the projection portions are inserted into the corresponding recessed portions, the substrate 10 and the sidewall 20 may be fastened to each other. For this, the size of the projection portion may be substantially equal to the size of the recessed portion, or the size of the recessed portion may be smaller than the size of the projection portion in order to firmly fix the sidewall 20 to the substrate 10. However, the sizes of the recessed portion and the projection portion are not limited thereto.

In some embodiments, the first to fourth projection portions 22a, 22b, 22c, and 22d may be formed on the sidewall 20. In the case where the sidewall 20 has the first to fourth projection portions 22a, 22b, 22c, and 22d, the substrate may have first to fourth recessed portions 11a, 11b, 11c, and 11d corresponding to the first to fourth projection portions 22a, 22b, 22c, and 22d. The first to fourth projection portions 22a, 22b, 22c, and 22d may be formed to correspond to the first to fourth recessed portions 11a, 11b, 11c, and 11d, respectively. Further, the sizes of the projection portions and the recessed portions may be different from each other. The lengths or the widths of the first to fourth projection portions 22a, 22b, 22c, and 22d may be different from each other. If the sizes of the first to fourth projection portions 22a, 22b, 22c, and 22d are different from each other, the sizes of the first to fourth recessed portions 11a, 11b, 11c, and 11d may also be different from each other. If the sizes of the first to fourth projection portions 22a, 22b, 22c, and 22d are different from each other, each of the projection portions may be inserted into the corresponding recessed portion only, but may be unable to be inserted into other recessed portions. Each of the projection portions can be inserted into the determined recessed portion only. By forming the projection portions and the recessed portions as described above, the sidewall 20 can be guided to be accurately fastened to the normal position when the sidewall 20 is fastened to the substrate 10.

Hereinafter, other embodiments will be described. In the embodiments hereinafter, the same reference numerals are generally used for the same configurations as the configurations as described above, and the duplicate description thereof will be omitted or simplified.

Figure 5:
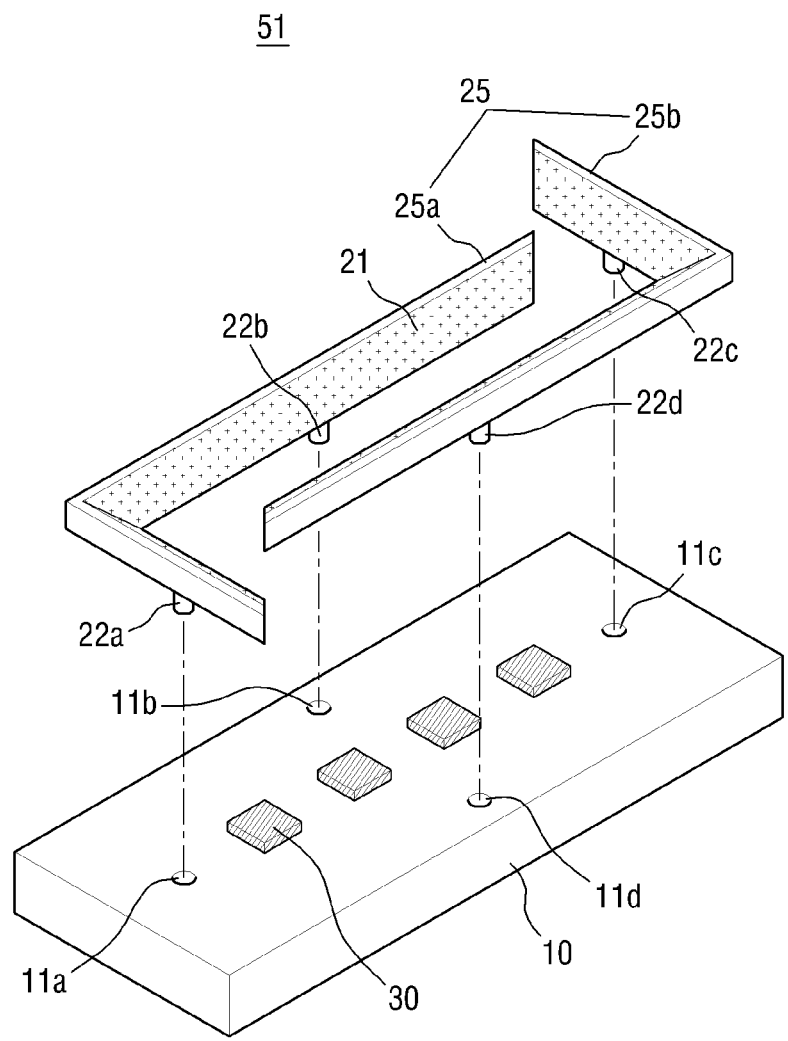
FIG. 5 is a perspective view of a light emitting module according to another embodiment.

FIG. 5 is a perspective view of a light emitting module according to another embodiment.

Referring to FIG. 5, a light emitting module 51 according to another embodiment is different from the embodiment of FIG. 1 in that a sidewall 25 thereof includes a first sub-sidewall 25a and a second sub-sidewall 25b which are in an "L" shape.

In the light emitting module 51, the sidewall 25 may be formed by assembling a plurality of sub-sidewalls. In some embodiments, the sidewall may include the first sub-sidewall 25a and the second sub-sidewall 25b, which are in an "L" shape. The first sub-sidewall 25a and the second sub-sidewall 25b may be fastened to the substrate 10 to form the sidewall 25. Since the first sub-sidewall 25a and the second sub-sidewall 25b, which are in an "L" shape, are fastened to the substrate 10 in a state where they face each other, the sidewall in a rectangular shape that surrounds the periphery of the light emitting chip 30 may be formed.

Figure 6:
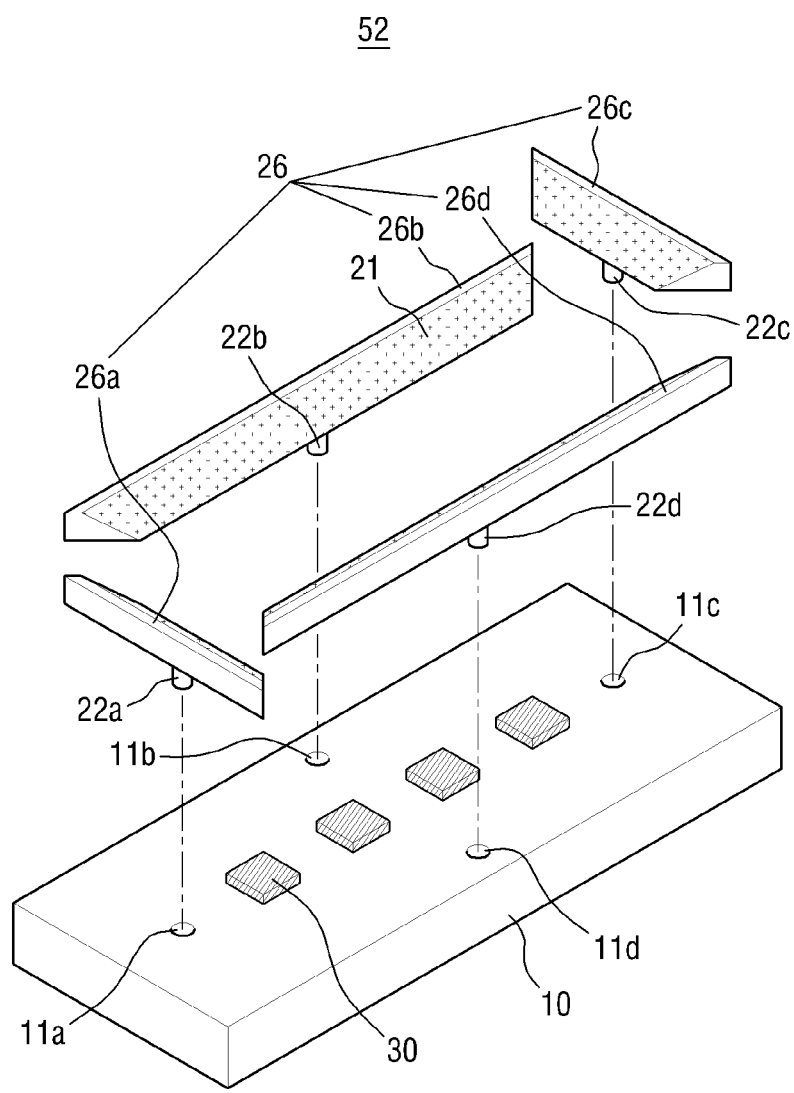
FIG. 6 is a perspective view of a light emitting module according to still another embodiment.

FIG. 6 is a perspective view of a light emitting module according to still another embodiment.

Referring to FIG. 6, a sidewall 26 of a light emitting module 52 according to still another embodiment is different from the embodiment of FIG. 5 in that a sidewall 26 of a light emitting module 52 includes four sub-sidewalls 26a, 26b, 26c, and 26d.

The light emitting module 52 may have four sub-sidewalls. In some embodiments in which the sidewall 26 is in a rectangular shape, the first to fourth sub-sidewalls 26a, 26b, 26c, and 26d may be in a bar shape. The first to fourth sub-sidewalls may be formed to correspond to four sides of the rectangle. In some embodiments, the first sub-sidewall 26a and the third sub-sidewall 26c may have substantially the same length, and the second sub-sidewall 26b and the fourth sub-sidewall 26d may have substantially the same length. However, this is just an example, and the lengths of the first to fourth sub-sidewalls are not limited thereto. The lengths of the first to fourth sub-sidewalls 26a, 26b, 26c, and 26d may be equal to each other.

As the first to fourth sub-sidewalls 26a, 26b, 26c, and 26d are fastened to the substrate 10, the rectangular sidewall 26 that surrounds the periphery of the light emitting chip 30 may be formed. In some embodiments, each of the sub-sidewalls may be provided with the fastener. As described above, the fastener may include the projection portion(s). FIG. 6 illustrates that one projection portion is formed on each of the sub-sidewalls, but the number of projection portions is not limited thereto. One or more projection portions may be formed.

In order to be fastened to the first to fourth sub-sidewalls 26a, 26b, 26c, and 26d, first to fourth recessed portions 11a, 11b, 11c, and 11d, which correspond to first to fourth projection portions 22a, 22b, 22c, and 22d of the first to fourth sub-sidewalls 26a, 26b, 26c, and 26d, may be formed on the substrate 10. The first recessed portion 11a that corresponds to the first projection portion 22a of the first sub-sidewall 26a, the second recessed portion 11b that corresponds to the second projection portion 22b of the second sub-sidewall 26b, the third recessed portion 11c that corresponds to the third projection portion 22c of the third sub-sidewall 26c, and the fourth recessed portion 11d that corresponds to the fourth projection portion 22d of the fourth sub-sidewall 26d may be arranged on the substrate 10.

In order for the first to fourth sub-sidewalls 26a, 26b, 26c, and 26d to be accurately fastened to determined positions, the positions or the sizes of the first to fourth projection portions 22a, 22b, 22c, and 22d may be different from each other. If the positions or the sizes of the first to fourth projection portions 22a, 22b, 22c, and 22d are different from each other, the positions or the sizes of the first to fourth recessed portions 11a, 11b, 11c, and 11d may also be different from each other. Each of the projection portions may be inserted and fastened to the corresponding recessed portion only, but may be unable to be fastened to other recessed portions. By forming the first to fourth projection portions 22a, 22b, 22c, and 22d and the first to fourth recessed portions 11a, 11b, 11c, and 11d as described above, the respective sub-sidewalls can be guided to be accurately fastened to the normal positions when the sidewall 26 is assembled.

Figure 7:
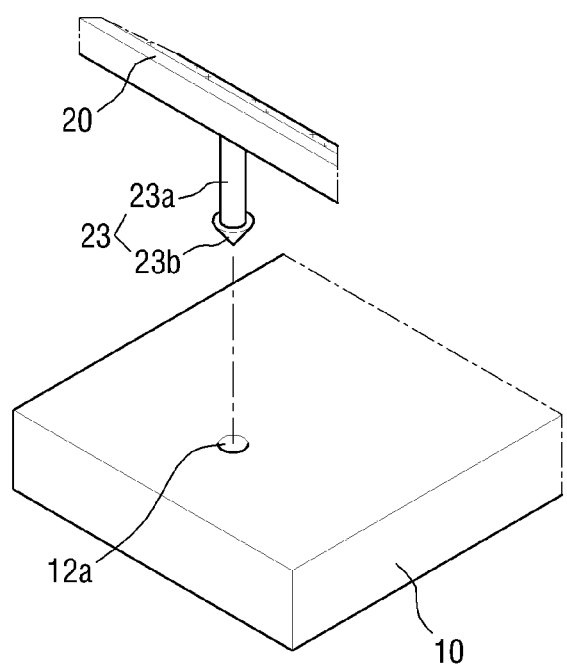
FIG. 7 is a perspective view of a modified example of a light emitting module fastening member according to the embodiments in FIGS. 4 to 6.

FIG. 7 is a perspective view of a modified example of a light emitting module fastener according to the embodiments in FIGS. 4 to 6, and FIG. 8 is a cross-sectional view of a modified example of a light emitting module fastener according to the embodiments in FIGS. 4 to 6.

Figure 8:
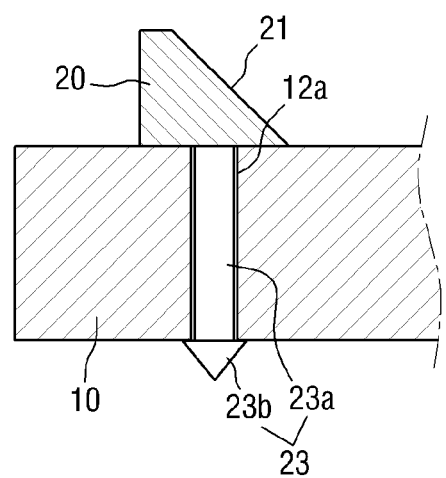
FIG. 8 is a cross-sectional view of a modified example of a light emitting module fastening member according to the embodiments in FIGS. 4 to 6.

Referring to FIGS. 7 and 8, the modified example is different from the embodiment of FIGS. 4 to 6 in that a projection portion 23 of a fastener includes a body portion 23a that projects from the sidewall and a fixing portion 23b that is arranged at an end portion of the body portion 23a, and one end of the fixing portion 23b that comes in contact with the end portion of the body portion 23a has a wider width than the width of the body portion 23a.

In some embodiments, the projection portion 23 may include the body portion 23a that projects from the sidewall 20 and the fixing portion 23b that is arranged at the end portion of the body portion 23a. Further, the width of the one end of the fixing portion 23b that comes in contact with the end portion of the body portion 23a may be wider than the width of the body portion 23a. The one end of the fixing portion 23b may be formed to extend from the body portion 23a. The fixing portion 23b may have a stepped structure. Further, in some embodiments, the width of the fixing portion 23b may be reduced as going to the other end thereof. The fixing portion may be formed so that the cross section thereof is in an arrow shape.

If the projection portion 23 includes the body portion 23a and the fixing portion 23b, a through-hole 12a that corresponds to the projection portion 23 may be formed on the substrate 10. The projection portion 23 may be inserted into the through-hole 12a of the substrate 10 so that the substrate 10 and the sidewall 20 are fastened to each other. The fixing portion 23b may be first inserted into the through-hole 12a of the substrate 10, and then the body portion 23a may be inserted therein. If the fixing portion 23b has completely passed through the through-hole 12a of the substrate 10, one end of the fixing portion 23b may come in contact with the lower surface of the substrate 10. The body portion 23a is completely inserted into the through-hole, and the one end of the fixing portion may come in contact with the lower surface of the substrate 10 to firmly fix the substrate 10 and the sidewall 20 to each other. The lower surface of the sidewall 20 may come in contact with the upper surface of the substrate 10, and the one end of the fixing portion 23b may come in contact with the lower surface of the substrate 10. For this, the diameter of the through-hole 12a may be larger than the width of the body portion 23a, and may be smaller than the width of the one end of the fixing portion 23b. Further, in order to be smoothly inserted into the through-hole 12a, the projection portion 23 may be formed of a material having elasticity, but the material of the projection portion 23 is not limited thereto.

Figure 9:
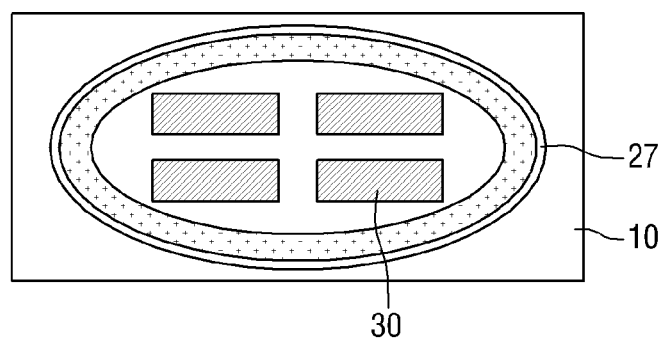
FIG. 9 is a plan view of a light emitting module according to still another embodiment.

FIG. 9 is a plan view of a light emitting module according to still another embodiment.

Referring to FIG. 9, a light emitting module 53 according to still another embodiment is different from the light emitting module according to the embodiment of FIG. 1 in that a sidewall 27 is formed in a circle.

As described above, it is illustrated that the sidewall is in a rectangular shape, but the shape of the sidewall is not limited thereto. In some embodiments, the sidewall 27 may have a shape including a circle, an ellipse, or having at least a curved portion. Even in this case, the inner surface 21 of the sidewall 27 may be downwardly inclined toward the light emitting chip 30.

Further, the light emitting chip 30 may be arranged in the form of a matrix having rows and columns. However, the arrangement type of the light emitting chip 30 is not limited thereto, and the light emitting chip 30 may be arranged in various shapes.

Figure 10:
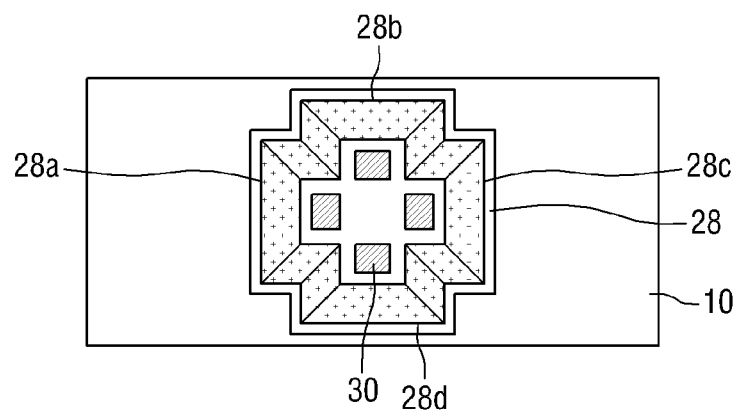
FIG. 10 is a plan view of a light emitting module according to still another embodiment.

FIG. 10 is a plan view of a light emitting module according to still another embodiment.

Referring to FIG. 10, a light emitting module 54 according to still another embodiment is different from the light emitting module according to the embodiment of FIG. 1 in that a sidewall 28 thereof is formed in a cross.

In some embodiments, the sidewall 28 may be in a cross shape having four projecting sides 28a, 28b, 28c, and 28d. In some embodiments in which the sidewall is in a cross shape having four projecting sides 28a, 28b, 28c, and 28d, four light emitting chips 30 may be arranged in a line with the projecting sides corresponding to the respective projection sides. However, this is just an example, and the number of light emitting chips 30 and the arrangement type thereof are not limited thereto.

Figure 11:
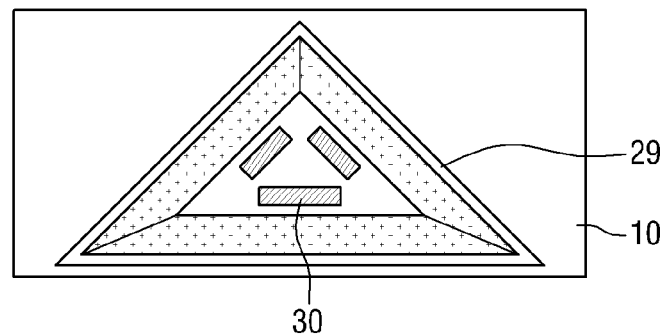
FIG. 11 is a plan view of a light emitting module according to still another embodiment.

FIG. 11 is a plan view of a light emitting module according to still another embodiment.

Referring to FIG. 11, a light emitting module 55 according to still another embodiment is different from the light emitting module according to the embodiment of FIG. 1 in that the light emitting module 55 is in the form of a triangle having three sides.

In some embodiments, a sidewall 29 may be in a triangle shape having three sides. If the sidewall is in the form of a triangle having three sides, three light emitting chips 30 may be arranged in a line with the respective sides corresponding to the respective sides. However, this is just an example, and the number of light emitting chips 30 and the arrangement type thereof are not limited thereto.

Figure 12:
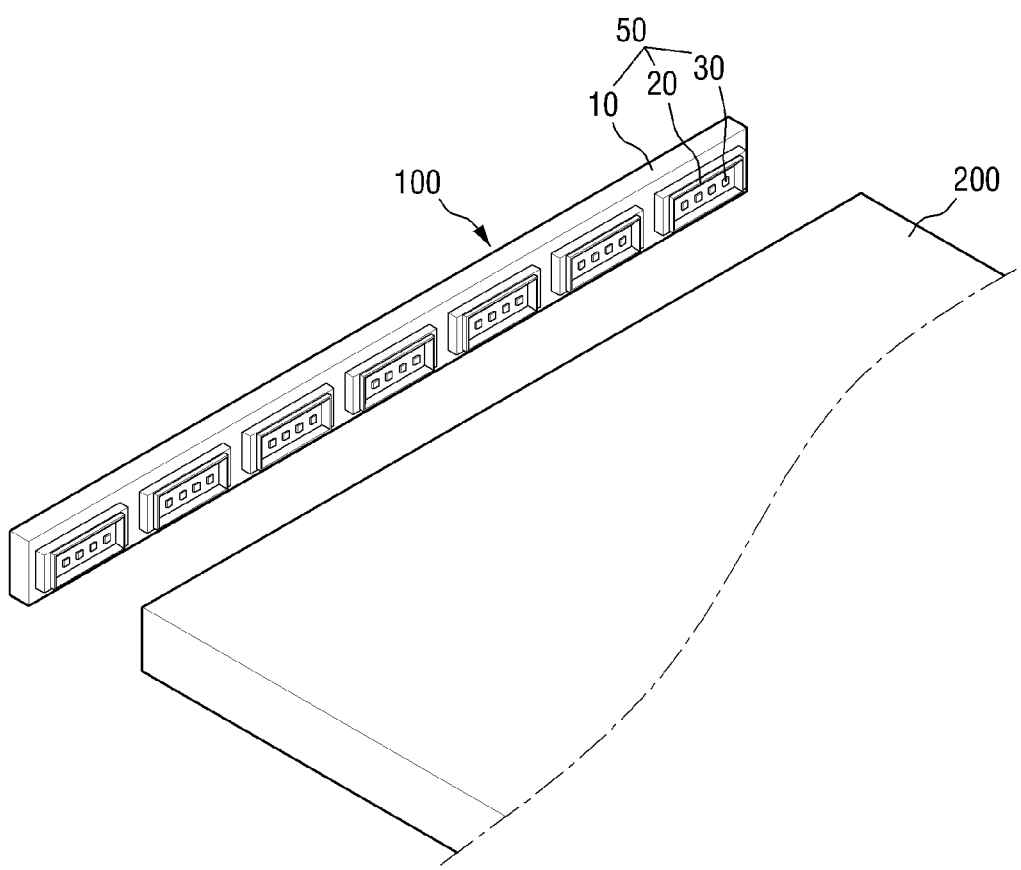
FIG. 12 is a perspective view of a backlight unit according to an embodiment.
Figure 13:
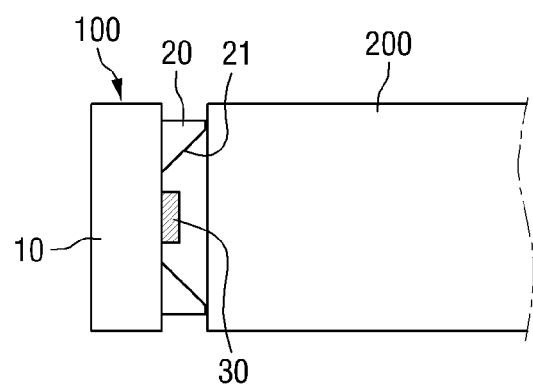
FIG. 13 is a cross-sectional view of a backlight unit according to the embodiment of FIG. 12.

FIG. 12 is a perspective view of a backlight unit according to an embodiment, and FIG. 13 is a cross-sectional view of the backlight unit of FIG. 12.

Referring to FIGS. 12 and 13, a backlight unit according to an embodiment includes a light source portion 100 which is in a bar shape that extends in a length direction and a light guide plate 200 that comes in contact with the light source portion 100.

The light source portion 100 may serve to provide light to the light guide plate 200. In some embodiments, the light source portion 100 may include a plurality of light emitting modules 50. A plurality of light emitting chips 30 may be formed on the substrate 10 that extends in the length direction, and a plurality of sidewalls 20 may divide and partition the plurality of light emitting chips 30. The light source portion 100 may include a plurality of spaces that are partitioned by the plurality of sidewalls 20, and at least one light emitting chip 30 may be arranged in each of the plurality of spaces. The plurality of sidewalls 20 may be spaced apart from each other by a predetermined distance, and may be aligned in a line along the length direction of the substrate 10, but are not limited thereto. The plurality of sidewalls 20 may be aligned in a matrix form having a plurality of columns.

Figure 14:
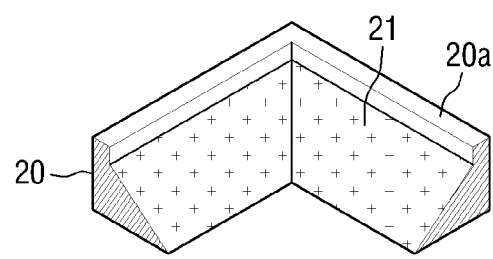
FIG. 14 is a partial perspective view of a backlight unit according to another embodiment.

The light guide plate 200 may be arranged on one side surface of the light source portion 100. Specifically, one side portion of the light guide plate 200 may face the plurality of light emitting chips 30 of the light source portion 100 and may come in contact with the light source portion 100. As described above, the height of the sidewall 20 may be higher than the height of the light emitting chip 30. In this case, the one side portion of the light guide plate 200 may come in contact with the upper surface of the sidewall 20. FIGS. 13 and 14 illustrate that the light source portion 100 is arranged on one side portion of the light guide plate 200. However, in some embodiments, a plurality of light source portions 100 may be provided in a manner that one light source portion 100 is arranged on one side portion of the light guide plate 200, and the other light source portion 100 is arranged on the other side portion of the light guide plate 200. The backlight unit according to some embodiments may be an edge type in which one or a pair of light sources is arranged on one side portion or both side portions of the light guide plate 200 to irradiate light.

Figure 15:
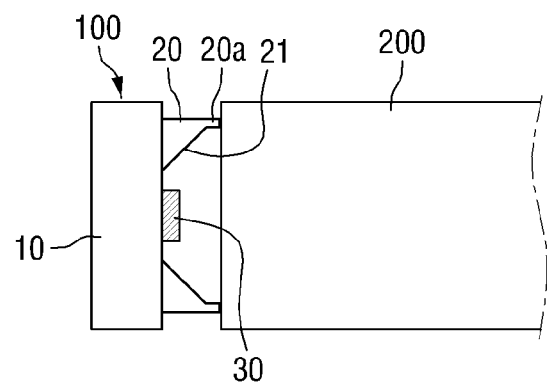
FIG. 15 is a cross-sectional view of a backlight unit according to the embodiment of FIG. 14.

FIG. 14 is a partial perspective view of a backlight unit according to another embodiment, and FIG. 15 is a cross-sectional view of a backlight unit according to the embodiment of FIG. 14.

Referring to FIGS. 14 and 15, a backlight unit according to another embodiment is different from the backlight unit according to the embodiment of FIGS. 12 and 13 in that a projection 20a that is formed to project from the upper surface of the sidewall 20 for a predetermined distance is provided.

The backlight unit may include the projection 20a that projects vertically upward from the upper surface of the sidewall 20. The projection 20a may have the same width as the width of the upper surface of the sidewall 20, but the width of the projection 20a is not limited thereto. Further, in some embodiments, the projection 20a may be formed to completely cover the upper surface of the sidewall 20, but is not limited thereto. The projection 20a may be formed to cover the upper surface of the sidewall 20 at least partly. If the backlight unit has the projection 20a that projects from the upper surface of the sidewall 20, the end portion of the projection 20a and the one side portion of the light guide plate 200 may come in contact with each other.

If the backlight unit has the projection 20a that projects from the upper surface of the sidewall 20, the distance between the light emitting chip 30 and the one side portion of the light guide plate 200 may become relatively long as compared with the embodiment of FIGS. 12 and 13. By increasing the distance between the light emitting chip 30 and the one side portion of the light guide plate 200 through forming of the projection 20a, the one side portion of the light guide plate 200 can be prevented from being thermally damaged due to heat generated from the light emitting chip 30.

Figure 16:
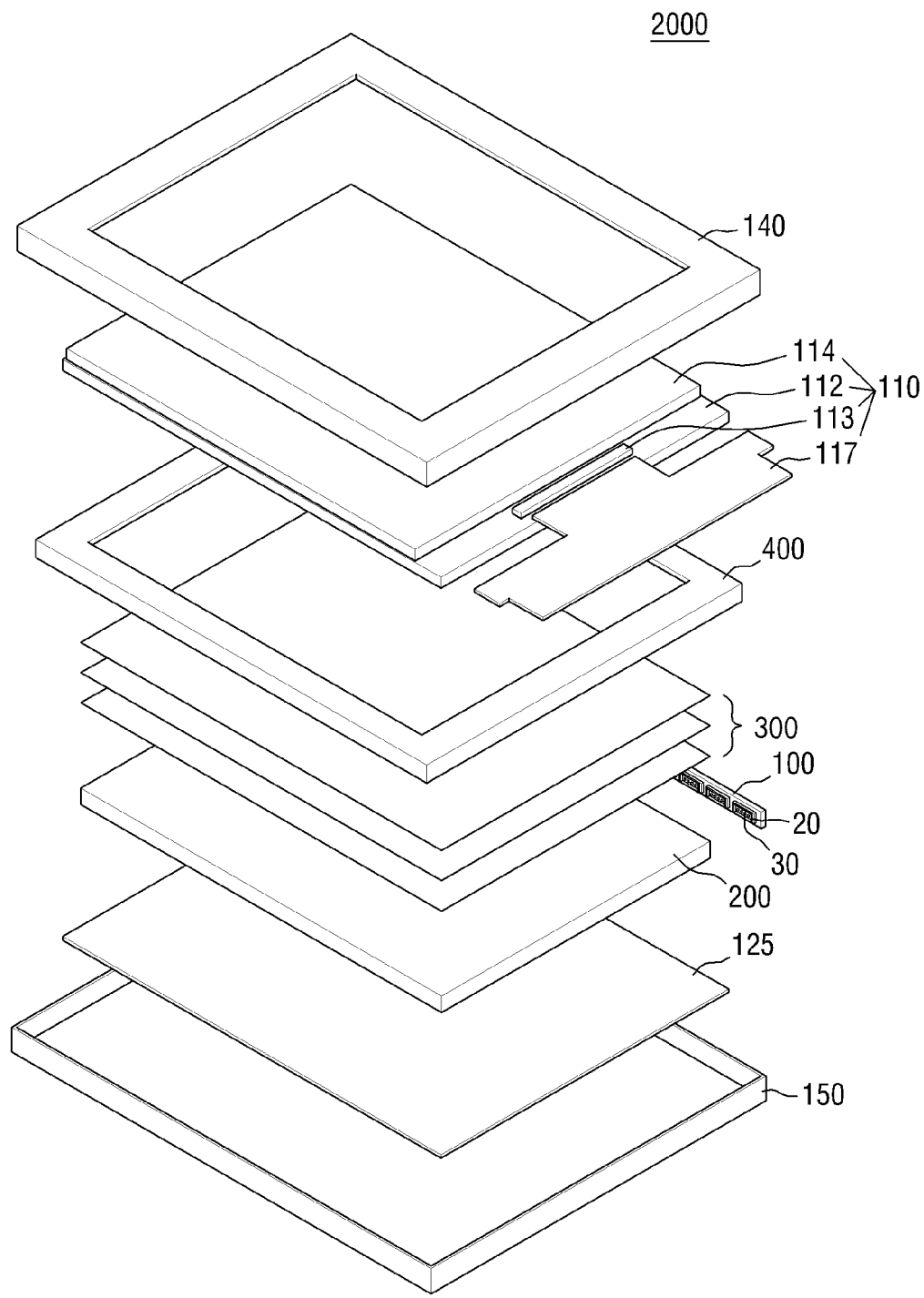
FIG. 16 is an exploded perspective view of a liquid crystal display according to an embodiment.

FIG. 16 is an exploded perspective view of a liquid crystal display according to an embodiment.

Referring to FIG. 16, a liquid crystal display 2000 according to an embodiment of includes a backlight unit including a light source portion 100 having at least one light emitting module 50 and extending in the length direction with a bar shape, and a light guide plate 200 having one side portion which faces the light emitting module 50 and comes in contact with the light source portion 100; a plurality of optical sheets 300 arranged on the light guide plate 200; and a display panel 110 seated on the optical sheets 300.

In the liquid crystal display 2000, the backlight unit may be substantially the same as the backlight unit according to some embodiments described above. Further, the light emitting module may be substantially the same as the light emitting module according to some embodiments described above. Accordingly, detailed description of the backlight unit and the light emitting module will be omitted.

As illustrated in FIG. 16, the liquid crystal display 2000 may further include a display panel 110, a top chassis 140, and a bottom chassis 150. Hereinafter, the liquid crystal display 2000 according to an embodiment of the present invention will be described in detail.

The display panel 110 includes a display region and a non-display region. Further, the display panel 110 may include a first substrate 112, a second substrate 114 that faces the first substrate 112, a liquid crystal layer (not illustrated), a driving portion 113 attached to the first substrate 112, and a flexible circuit board 117.

The display region of the display panel 110 may mean a region where an image is displayed, and the non-display region of the display panel 110 may mean a region where an image is not displayed. On the plan view of the display panel 110, as described below, the display region may be positioned in the center portion of the region where the first substrate 112 and the second substrate 114 overlap each other, and the non-display region may be positioned in the border portion of the region where the first substrate 112 and the second substrate 114 overlap each other. Further, the display region may be a region where the display panel 110 and the top chassis 140 do not overlap each other, and the non-display region may be a region where the display panel 110 and the top chassis 140 overlap each other. Further, on the plan view of the display panel 110, the shape of the display region may be similar to the shape of the second substrate 114, and the inner area of the display region may be smaller than the inner area of the second substrate 110. Further, on the plan view of the display panel 114, the boundary lines between the display region and the non-display region may be in parallel to sides of the second substrate 114 that face the boundary lines, respectively. Further, the boundary line between the display region and the non-display region may be in a rectangular shape.

At least a part of the first substrate 112 may overlap the second substrate 114. The center portion of the region where the first substrate 112 and the second substrate 114 overlap each other may be the display region, and the border portion of the region where the first substrate 112 and the second substrate 114 overlap each other may be the non-display region. The driving portion 113 and the flexible circuit board 117 may be attached to the region where the first substrate 112 and the second substrate 114 do not overlap each other.

The second substrate 114 may be arranged to face the first substrate 112. The liquid crystal layer may be interposed between the first substrate 112 and the second substrate 114. Between the first substrate 112 and the second substrate 114, a sealing member, such as a sealant, may be arranged along the border portion between the first substrate 112 and the second substrate 114 to adhere and seal the first substrate 112 and the second substrate 114.

The first substrate 112 and the second substrate 114 may be in a cuboidal shape. For convenience in explanation, the shapes of the first substrate 112 and the second substrate 114 are illustrated as cuboids, but are not limited thereto. The first substrate 112 and the second substrate 114 may be manufactured in various shapes depending on the shape of the display panel 110.

The driving portion 113 may apply various signals, such as, for example, driving signals, which are required to display an image in the display region. The flexible circuit board 117 may output various kinds of signals to the driving portion 113.

On the other surface of the display panel 110, the backlight unit may be arranged. The backlight unit may include a light source portion 100 that emits light and a light guide plate 200 that guides the light emitted from the light source portion 100. The liquid crystal display 2000 may include a reflection sheet 125 arranged on the lower side of the light guide plate 200 to change a path of the light that propagates to the lower side of the light guide plate 200, at least one optical sheet 300 arranged on the upper side of the light guide plate 200 to modulate the optical properties of the emitted light, and a mold frame 400 that accommodates the above-described sheets.

The mold frame 400 may come in contact with the border portion of the other surface of the display panel 110 to support and fix the display panel 110. In some embodiments, the border portion of the other surface of the display panel 110 may be the non-display region of the display panel 110. At least a part of the mold frame 400 may overlap the non-display region of the display panel 110.

The top chassis 140 may cover the border of the display panel 110, and may surround the side surfaces of the display panel 110 and the light source portion 100. The bottom chassis 150 may accommodate the optical sheet(s) 300, the light guide plate 200, the backlight unit, and the reflection sheet 125. The top chassis 140 and the bottom chassis 150 may be made of a conductive material, such as, for example, metal.

Although certain embodiments of the present invention have been described for illustrative purposes, those skilled in the art will appreciate that various modifications, additions and substitutions are possible, without departing from the scope and spirit of the invention as disclosed in the accompanying claims.

While the present invention has been particularly shown and described with reference to certain embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A light emitting module comprising:
   at least one light emitting chip mounted on a substrate;
   a sidewall including a fastener fastened to the substrate and surrounding the light emitting chip, wherein the sidewall includes a transparent material; and
   a transparent resin mixed with phosphor configured to fill a space partitioned by the sidewall,
   wherein an inner surface of the sidewall is downwardly inclined toward the light emitting chip, and the inner surface of the sidewall and an upper surface of the substrate form a first angle,
   wherein the fastener comprises a plurality of projection portions,
   wherein sizes of the projection portions are different from each other,
   wherein a plurality of recessed portions corresponding to the projection portions are formed on the substrate, and
   wherein sizes of the recessed portions correspond to the sizes of the projection portions.

2. The light emitting module of claim 1, wherein the light emitting chip is a light emitting diode chip.

3. The light emitting module of claim 1, wherein a plurality of light emitting chips are provided, and the plurality of light emitting chips are arranged in a line and are spaced apart from each other by a predetermined distance.

4. The light emitting module of claim 1, wherein the inner surface of the sidewall includes a reflective surface.

5. The light emitting module of claim 4, wherein a coating layer is formed on the inner surface of the sidewall, and the coating layer includes at least one of silver, titanium oxide, or silicon oxide.

6. The light emitting module of claim 1, wherein the first angle is between about 100 and 150 degrees.

7. The light emitting module of claim 1, wherein the fastener comprises at least one projection portion, and wherein at least one recessed portion corresponding to the projection portion is formed on the substrate.

8. The light emitting module of claim 1, wherein the projection portion comprises a body portion projecting from the sidewall and a fixing portion arranged at an end portion of the body portion, and wherein a width of one end of the fixing portion that comes in contact with the end portion of the body portion is larger than a width of the body portion.

9. The light emitting module of claim 1, wherein the sidewall comprises a first sub-sidewall and a second sub-sidewall together forming an "L" shape, and the first sub-sidewall and the second sub-sidewall are respectively fastened to the substrate.

10. The light emitting module of claim 1, wherein the sidewall comprises first to fourth sub-sidewalls formed in a bar shape, and the first to fourth sub-sidewalls are respectively fastened to the substrate.

11. The light emitting module of claim 1, wherein the sidewall is in a circular shape and surrounds the light emitting chip.

12. The light emitting module of claim 1, wherein the sidewall surrounds the light emitting chip, and is in a cross shape having four projecting sides.

13. The light emitting module of claim 1, wherein the sidewall is in a triangular shape having three sides.

14. An edge type backlight unit comprising:
- a light source portion including at least one light emitting module and extending in a length direction with a bar shape; and
- a light guide plate having one side portion which faces the light emitting module and comes in contact with the light source portion,
- wherein the light emitting module includes:
  - at least one light emitting chip mounted on a substrate;
  - a sidewall including a fastener configured to be fastened to the substrate and surrounding the light emitting chip, wherein the sidewall includes a transparent material; and
  - a transparent resin mixed with phosphor and configured to fill a space partitioned by the sidewall,
- wherein an inner surface of the sidewall is downwardly inclined toward the light emitting chip, and the inner surface of the sidewall and an upper surface of the substrate form a first angle,
- wherein the fastener comprises a plurality of projection portions,
- wherein sizes of the projection portions are different from each other,
- wherein a plurality of recessed portions corresponding to the projection portions are formed on the substrate, and
- wherein sizes of the recessed portions correspond to the sizes of the projection portions.

15. The backlight unit of claim 14, wherein the light source portion comprises a plurality of light emitting modules, and the plurality of light emitting modules are arranged in a line along a length direction of the light source portion.

16. The backlight unit of claim 14, wherein the first angle is between about 100 and 150 degrees.

17. The backlight unit of claim 14, further comprising a projection formed to project from an upper surface of the sidewall, wherein the one side portion of the light guide plate comes in contact with an upper surface of the projection.

18. A liquid crystal display comprising:
- an edge type backlight unit including a light source portion having at least one light emitting module and extending in a length direction with a bar shape, and a light guide plate having one side portion which faces the light emitting module and comes in contact with the light source portion;
- a plurality of optical sheets arranged on the light guide plate; and
- a display panel seated on the plurality of optical sheets,
- wherein the light emitting module includes:
  - at least one light emitting chip mounted on a substrate;
  - a sidewall including a fastener configured to be fastened to the substrate and surrounding the light emitting chip, wherein the sidewall includes a transparent material; and
  - a transparent resin mixed with phosphor configured to fill a space partitioned by the sidewall,
- wherein an inner surface of the sidewall is downwardly inclined toward the light emitting chip, and the inner surface of the sidewall and an upper surface of the substrate form a first angle,
- wherein the fastener comprises a plurality of projection portions,
- wherein sizes of the projection portions are different from each other,
- wherein a plurality of recessed portions corresponding to the projection portions are formed on the substrate, and
- wherein sizes of the recessed portions correspond to the sizes of the projection portion.

* * * * *